(12) United States Patent
Dunlap

(10) Patent No.: US 10,546,833 B2
(45) Date of Patent: *Jan. 28, 2020

(54) METHOD OF FORMING A PLURALITY OF ELECTRONIC COMPONENT PACKAGES

(71) Applicant: Amkor Technology, Inc., Tempe, AZ (US)

(72) Inventor: Brett Arnold Dunlap, Queen Creek, AZ (US)

(73) Assignee: Amkor Technology, Inc., Tempe, AZ (US)

( * ) Notice: Subject to any disclaimer, the term of this patent is extended or adjusted under 35 U.S.C. 154(b) by 176 days.

This patent is subject to a terminal disclaimer.

(21) Appl. No.: 15/634,861

(22) Filed: Jun. 27, 2017

(65) Prior Publication Data

US 2017/0294405 A1    Oct. 12, 2017

Related U.S. Application Data

(63) Continuation of application No. 12/632,170, filed on Dec. 7, 2009, now Pat. No. 9,691,734.

(51) Int. Cl.
*H01L 23/00* (2006.01)
*H01L 21/48* (2006.01)
(Continued)

(52) U.S. Cl.
CPC .......... *H01L 24/94* (2013.01); *H01L 21/4857* (2013.01); *H01L 21/561* (2013.01);
(Continued)

(58) Field of Classification Search
CPC ..... H01L 24/96; H01L 24/97; H01L 21/4857; H01L 21/568; H01L 21/78; H01L 21/19; H01L 21/94
See application file for complete search history.

(56) References Cited

U.S. PATENT DOCUMENTS

| 2,596,993 A | 5/1952 | Gookin |
|---|---|---|
| 3,435,815 A | 4/1969 | Forcier |

(Continued)

FOREIGN PATENT DOCUMENTS

| DE | 19734794 | 7/1998 |
|---|---|---|
| EP | 0 393 997 | 10/1991 |

(Continued)

OTHER PUBLICATIONS

IBM Technical Disclosure Bulletin, "Microstructure Solder Mask by Means of a Laser", vol. 36, Issue 11, p. 589, Nov. 1, 1993. (NN9311589).

(Continued)

*Primary Examiner* — Livius R. Cazan

(74) *Attorney, Agent, or Firm* — McAndrews, Held & Malloy, Ltd.

(57) ABSTRACT

A method of forming a plurality of electronic component packages includes attaching electronic components to a carrier, wherein high aspect ratio spaces exist between the electronic components. A dielectric sheet is laminated around the electronic components thus filling the spaces and forming a package body. The spaces are completely and reliably filled by the dielectric sheet and thus the package body has an absence of voids. Further, an upper surface of the package body is planar, i.e., has an absence of ripples or other non-uniformities. Further, lamination of the dielectric sheet is performed with a low cost lamination system.

20 Claims, 5 Drawing Sheets

(51) Int. Cl.
  *H01L 21/56* (2006.01)
  *H01L 21/78* (2006.01)
(52) U.S. Cl.
  CPC ............ *H01L 21/568* (2013.01); *H01L 21/78* (2013.01); *H01L 24/96* (2013.01)

(56) References Cited

U.S. PATENT DOCUMENTS

| | | |
|---|---|---|
| 3,734,660 A | 5/1973 | Davies et al. |
| 3,838,984 A | 10/1974 | Crane et al. |
| 3,868,724 A | 2/1975 | Perrino |
| 3,916,434 A | 10/1975 | Garboushian |
| 4,054,238 A | 10/1977 | Lloyd et al. |
| 4,189,342 A | 2/1980 | Kock |
| 4,258,381 A | 3/1981 | Inaba |
| 4,289,922 A | 9/1981 | Devlin |
| 4,301,464 A | 11/1981 | Otsuki et al. |
| 4,322,778 A | 3/1982 | Barbour et al. |
| 4,332,537 A | 6/1982 | Slepcevic |
| 4,417,266 A | 11/1983 | Grabbe |
| 4,451,224 A | 5/1984 | Harding |
| 4,530,152 A | 7/1985 | Roche et al. |
| 4,532,419 A | 7/1985 | Takeda |
| 4,541,003 A | 9/1985 | Otsuka et al. |
| 4,642,160 A | 2/1987 | Burges |
| 4,645,552 A | 2/1987 | Vitriol et al. |
| 4,646,710 A | 3/1987 | Schmid et al. |
| 4,685,033 A | 8/1987 | Inoue |
| 4,706,167 A | 11/1987 | Sullivan |
| 4,707,724 A | 11/1987 | Suzuki et al. |
| 4,716,049 A | 12/1987 | Patraw |
| 4,727,633 A | 3/1988 | Herrick |
| 4,729,061 A | 3/1988 | Brown |
| 4,737,839 A | 4/1988 | Burt |
| 4,756,080 A | 7/1988 | Thorp, Jr. et al. |
| 4,786,952 A | 11/1988 | Maciver et al. |
| 4,806,188 A | 2/1989 | Rellick |
| 4,811,082 A | 3/1989 | Jacobs et al. |
| 4,812,896 A | 3/1989 | Rothgery et al. |
| 4,862,245 A | 8/1989 | Pashby et al. |
| 4,862,246 A | 8/1989 | Masuda et al. |
| 4,897,338 A | 1/1990 | Spicciati et al. |
| 4,905,124 A | 2/1990 | Banjo et al. |
| 4,907,067 A | 3/1990 | Derryberry |
| 4,920,074 A | 4/1990 | Shimizu et al. |
| 4,935,803 A | 6/1990 | Kalf et al. |
| 4,942,454 A | 7/1990 | Mori et al. |
| 4,964,212 A | 10/1990 | Deroux-Dauphin et al. |
| 4,974,120 A | 11/1990 | Kodai et al. |
| 4,987,475 A | 1/1991 | Schlesinger et al. |
| 4,996,391 A | 2/1991 | Schmidt |
| 5,018,003 A | 5/1991 | Yasunaga et al. |
| 5,021,047 A | 6/1991 | Movern |
| 5,029,386 A | 7/1991 | Chao et al. |
| 5,041,902 A | 8/1991 | McShane |
| 5,057,900 A | 10/1991 | Yamazaki |
| 5,059,379 A | 10/1991 | Tsutsumi et al. |
| 5,065,223 A | 11/1991 | Matsuki et al. |
| 5,070,039 A | 12/1991 | Johnson et al. |
| 5,072,075 A | 12/1991 | Lee et al. |
| 5,072,520 A | 12/1991 | Nelson |
| 5,081,520 A | 1/1992 | Yoshii et al. |
| 5,087,961 A | 2/1992 | Long et al. |
| 5,091,341 A | 2/1992 | Asada et al. |
| 5,091,769 A | 2/1992 | Eichelberaer |
| 5,096,852 A | 3/1992 | Hobson |
| 5,108,553 A | 4/1992 | Foster et al. |
| 5,110,664 A | 5/1992 | Nakanishi et al. |
| 5,118,298 A | 6/1992 | Murphy |
| 5,122,860 A | 6/1992 | Kikuchi et al. |
| 5,134,773 A | 8/1992 | LeMaire et al. |
| 5,151,039 A | 9/1992 | Murphy |
| 5,157,475 A | 10/1992 | Yamaguchi |
| 5,157,480 A | 10/1992 | McShane et al. |
| 5,168,368 A | 12/1992 | Gow et al. |
| 5,172,213 A | 12/1992 | Zimmerman |
| 5,172,214 A | 12/1992 | Casto |
| 5,175,060 A | 12/1992 | Enomoto et al. |
| 5,191,174 A | 3/1993 | Chana et al. |
| 5,200,362 A | 4/1993 | Lin et al. |
| 5,200,809 A | 4/1993 | Kwon |
| 5,214,845 A | 6/1993 | King et al. |
| 5,216,278 A | 6/1993 | Lin et al. |
| 5,218,231 A | 6/1993 | Kudo |
| 5,221,642 A | 6/1993 | Burns |
| 5,229,550 A | 7/1993 | Bindra et al. |
| 5,239,448 A | 8/1993 | Perkins et al. |
| 5,247,429 A | 9/1993 | Iwase et al. |
| 5,250,841 A | 10/1993 | Sloan et al. |
| 5,250,843 A | 10/1993 | Eichelberger |
| 5,252,853 A | 10/1993 | Michii |
| 5,258,094 A | 11/1993 | Furui et al. |
| 5,266,834 A | 11/1993 | Nishi et al. |
| 5,268,310 A | 12/1993 | Goodrich et al. |
| 5,273,938 A | 12/1993 | Lin et al. |
| 5,277,972 A | 1/1994 | Sakumoto et al. |
| 5,278,446 A | 1/1994 | Nagaraj et al. |
| 5,278,726 A | 1/1994 | Bernardoni et al. |
| 5,279,029 A | 1/1994 | Burns |
| 5,281,849 A | 1/1994 | Singh Deo et al. |
| 5,283,459 A | 2/1994 | Hirano et al. |
| 5,294,897 A | 3/1994 | Notani et al. |
| 5,327,008 A | 7/1994 | Djennas et al. |
| 5,332,864 A | 7/1994 | Liana et al. |
| 5,335,771 A | 8/1994 | Murphy |
| 5,336,931 A | 8/1994 | Juskey et al. |
| 5,343,076 A | 8/1994 | Katayama et al. |
| 5,353,498 A | 10/1994 | Fillion et al. |
| 5,358,905 A | 10/1994 | Chiu |
| 5,365,106 A | 11/1994 | Watanabe |
| 5,371,654 A | 12/1994 | Beaman et al. |
| 5,379,191 A | 1/1995 | Carey et al. |
| 5,381,042 A | 1/1995 | Lerner et al. |
| 5,391,439 A | 2/1995 | Tomita et al. |
| 5,394,303 A | 2/1995 | Yamaji |
| 5,404,044 A | 4/1995 | Booth et al. |
| 5,406,124 A | 4/1995 | Morita et al. |
| 5,410,180 A | 4/1995 | Fuji et al. |
| 5,414,299 A | 5/1995 | Wang et al. |
| 5,417,905 A | 5/1995 | Lemaire et al. |
| 5,424,576 A | 6/1995 | Djennas et al. |
| 5,428,248 A | 6/1995 | Cha |
| 5,432,677 A | 7/1995 | Mowatt et al. |
| 5,435,057 A | 7/1995 | Bindra et al. |
| 5,444,301 A | 8/1995 | Song et al. |
| 5,452,511 A | 9/1995 | Chana |
| 5,454,905 A | 10/1995 | Foaelson |
| 5,463,253 A | 10/1995 | Waki et al. |
| 5,474,957 A | 12/1995 | Urushima |
| 5,474,958 A | 12/1995 | Djennas et al. |
| 5,484,274 A | 1/1996 | Neu |
| 5,493,151 A | 2/1996 | Asada et al. |
| 5,497,033 A | 3/1996 | Fillion et al. |
| 5,508,556 A | 4/1996 | Lin |
| 5,508,938 A | 4/1996 | Wheeler |
| 5,517,056 A | 5/1996 | Bialer et al. |
| 5,521,429 A | 5/1996 | Aono et al. |
| 5,528,076 A | 6/1996 | Pavio |
| 5,530,288 A | 6/1996 | Stone |
| 5,531,020 A | 7/1996 | Durand et al. |
| 5,534,467 A | 7/1996 | Rostoker |
| 5,539,251 A | 7/1996 | Iverson et al. |
| 5,543,657 A | 8/1996 | Diffenderler et al. |
| 5,544,412 A | 8/1996 | Romero et al. |
| 5,545,923 A | 8/1996 | Barber |
| 5,546,654 A | 8/1996 | Woinarowski et al. |
| 5,574,309 A | 11/1996 | Papapietro et al. |
| 5,576,517 A | 11/1996 | Woinarowski et al. |
| 5,578,525 A | 11/1996 | Mizukoshi |
| 5,581,122 A | 12/1996 | Chao et al. |
| 5,581,498 A | 12/1996 | Ludwig et al. |
| 5,582,858 A | 12/1996 | Adamopoulos et al. |
| 5,592,019 A | 1/1997 | Ueda et al. |
| 5,592,025 A | 1/1997 | Clark et al. |

(56) References Cited

U.S. PATENT DOCUMENTS

| | | |
|---|---|---|
| 5,594,274 A | 1/1997 | Suetaki |
| 5,595,934 A | 1/1997 | Kim |
| 5,604,376 A | 2/1997 | Hamburgen et al. |
| 5,608,265 A | 3/1997 | Kitano et al. |
| 5,608,267 A | 3/1997 | Mahulikar et al. |
| 5,616,422 A | 4/1997 | Ballard et al. |
| 5,619,068 A | 4/1997 | Benzoni |
| 5,625,222 A | 4/1997 | Yoneda et al. |
| 5,633,528 A | 5/1997 | Abbott et al. |
| 5,637,832 A | 6/1997 | Danner |
| 5,639,990 A | 6/1997 | Nishihara et al. |
| 5,640,047 A | 6/1997 | Nakashima |
| 5,641,997 A | 6/1997 | Ohta et al. |
| 5,643,433 A | 7/1997 | Fukase et al. |
| 5,644,169 A | 7/1997 | Chun |
| 5,646,831 A | 7/1997 | Manteghi |
| 5,650,663 A | 7/1997 | Parthasarathi |
| 5,661,088 A | 8/1997 | Tessier et al. |
| 5,665,996 A | 9/1997 | Williams et al. |
| 5,673,479 A | 10/1997 | Hawthorne |
| 5,674,785 A | 10/1997 | Akram et al. |
| 5,683,806 A | 11/1997 | Sakumoto et al. |
| 5,689,135 A | 11/1997 | Ball |
| 5,696,666 A | 12/1997 | Miles et al. |
| 5,701,034 A | 12/1997 | Marrs |
| 5,703,407 A | 12/1997 | Hori |
| 5,710,064 A | 1/1998 | Song et al. |
| 5,719,749 A | 2/1998 | Stopperan |
| 5,723,899 A | 3/1998 | Shin |
| 5,724,233 A | 3/1998 | Honda et al. |
| 5,726,493 A | 3/1998 | Yamashita et al. |
| 5,736,432 A | 4/1998 | Mackessy |
| 5,736,448 A | 4/1998 | Saia et al. |
| 5,739,581 A | 4/1998 | Chillara |
| 5,739,585 A | 4/1998 | Akram et al. |
| 5,739,588 A | 4/1998 | Ishida et al. |
| 5,742,479 A | 4/1998 | Asakura |
| 5,745,984 A | 5/1998 | Cole, Jr. et al. |
| 5,753,532 A | 5/1998 | Sim |
| 5,753,977 A | 5/1998 | Kusaka et al. |
| 5,766,972 A | 6/1998 | Takahashi et al. |
| 5,769,989 A | 6/1998 | Hoffmeyer et al. |
| 5,770,888 A | 6/1998 | Song et al. |
| 5,774,340 A | 6/1998 | Chang et al. |
| 5,776,798 A | 7/1998 | Quan et al. |
| 5,783,861 A | 7/1998 | Son |
| 5,784,259 A | 7/1998 | Asakura |
| 5,786,238 A | 7/1998 | Pai et al. |
| 5,798,014 A | 8/1998 | Weber |
| 5,801,440 A | 9/1998 | Chu et al. |
| 5,814,877 A | 9/1998 | Diffenderfer et al. |
| 5,814,881 A | 9/1998 | Alagaratnam et al. |
| 5,814,883 A | 9/1998 | Sawai et al. |
| 5,814,884 A | 9/1998 | Davis et al. |
| 5,817,540 A | 10/1998 | Wark |
| 5,818,105 A | 10/1998 | Kouda |
| 5,821,457 A | 10/1998 | Moslev et al. |
| 5,821,615 A | 10/1998 | Lee |
| 5,822,190 A | 10/1998 | Iwasaki |
| 5,826,330 A | 10/1998 | Isoda et al. |
| 5,834,830 A | 11/1998 | Cho |
| 5,835,355 A | 11/1998 | Dordi |
| 5,835,988 A | 11/1998 | Ishii |
| 5,841,193 A | 11/1998 | Eichelberger |
| 5,844,306 A | 12/1998 | Fujita et al. |
| 5,847,453 A | 12/1998 | Uematsu et al. |
| 5,856,911 A | 1/1999 | Riley |
| 5,859,471 A | 1/1999 | Kuraishi et al. |
| 5,859,475 A | 1/1999 | Freyman et al. |
| 5,866,939 A | 2/1999 | Shin et al. |
| 5,866,952 A | 2/1999 | Wojnarowski et al. |
| 5,871,782 A | 2/1999 | Choi |
| 5,874,770 A | 2/1999 | Saia et al. |
| 5,874,784 A | 2/1999 | Aoki et al. |
| 5,877,043 A | 3/1999 | Alcoe et al. |
| 5,883,425 A | 3/1999 | Kobayashi |
| 5,886,397 A | 3/1999 | Ewer |
| 5,886,398 A | 3/1999 | Low et al. |
| 5,894,108 A | 4/1999 | Mostafazadeh et al. |
| 5,897,339 A | 4/1999 | Song et al. |
| 5,900,676 A | 5/1999 | Kweon et al. |
| 5,903,049 A | 5/1999 | Mori |
| 5,903,050 A | 5/1999 | Thurairaiaratnam et al. |
| 5,903,052 A | 5/1999 | Chen et al. |
| 5,907,477 A | 5/1999 | Tuttle et al. |
| 5,909,053 A | 6/1999 | Fukase et al. |
| 5,915,998 A | 6/1999 | Stidham et al. |
| 5,917,242 A | 6/1999 | Ball |
| 5,936,843 A | 8/1999 | Ohshima et al. |
| 5,937,324 A | 8/1999 | Abercrombie et al. |
| 5,939,779 A | 8/1999 | Kim |
| 5,942,794 A | 8/1999 | Okumura et al. |
| 5,951,305 A | 9/1999 | Haba |
| 5,952,611 A | 9/1999 | Eng et al. |
| 5,959,356 A | 9/1999 | Oh |
| 5,969,426 A | 10/1999 | Baba et al. |
| 5,973,388 A | 10/1999 | Chew et al. |
| 5,976,912 A | 11/1999 | Fukutomi et al. |
| 5,977,613 A | 11/1999 | Takata et al. |
| 5,977,615 A | 11/1999 | Yamaguchi et al. |
| 5,977,630 A | 11/1999 | Woodworth et al. |
| 5,981,314 A | 11/1999 | Glenn et al. |
| 5,982,632 A | 11/1999 | Mosley et al. |
| 5,986,333 A | 11/1999 | Nakamura |
| 5,986,885 A | 11/1999 | Wyland |
| 6,001,671 A | 12/1999 | Fjelstad |
| 6,004,619 A | 12/1999 | Dippon et al. |
| 6,013,947 A | 1/2000 | Lim |
| 6,013,948 A | 1/2000 | Akram et al. |
| 6,018,189 A | 1/2000 | Mizuno |
| 6,020,625 A | 2/2000 | Qin et al. |
| 6,021,564 A | 2/2000 | Hanson |
| 6,025,640 A | 2/2000 | Yagi et al. |
| 6,028,364 A | 2/2000 | Ogino et al. |
| 6,031,279 A | 2/2000 | Lenz |
| RE36,613 E | 3/2000 | Ball |
| 6,034,423 A | 3/2000 | Mostafazadeh et al. |
| 6,034,427 A | 3/2000 | Lan et al. |
| 6,035,527 A | 3/2000 | Tamm |
| 6,040,622 A | 3/2000 | Wallace |
| 6,040,626 A | 3/2000 | Cheah |
| 6,043,430 A | 3/2000 | Chun |
| 6,060,768 A | 5/2000 | Hayashida et al. |
| 6,060,769 A | 5/2000 | Wark |
| 6,060,778 A | 5/2000 | Jeong et al. |
| 6,069,407 A | 5/2000 | Hamzehdoost |
| 6,072,228 A | 6/2000 | Hinkle et al. |
| 6,072,243 A | 6/2000 | Nakanishi |
| 6,075,284 A | 6/2000 | Choi et al. |
| 6,081,029 A | 6/2000 | Yamaguchi |
| 6,081,036 A | 6/2000 | Hirano et al. |
| 6,084,310 A | 7/2000 | Mizuno et al. |
| 6,087,715 A | 7/2000 | Sawada et al. |
| 6,087,722 A | 7/2000 | Lee et al. |
| 6,100,594 A | 8/2000 | Fukui et al. |
| 6,113,474 A | 9/2000 | Shih et al. |
| 6,114,752 A | 9/2000 | Huang et al. |
| 6,118,174 A | 9/2000 | Kim |
| 6,118,184 A | 9/2000 | Ishio et al. |
| 6,119,338 A | 9/2000 | Wang et al. |
| 6,122,171 A | 9/2000 | Akram et al. |
| RE36,907 E | 10/2000 | Templeton, Jr. et al. |
| 6,127,833 A | 10/2000 | Wu et al. |
| 6,130,115 A | 10/2000 | Okumura et al. |
| 6,130,473 A | 10/2000 | Mostafazadeh et al. |
| 6,133,623 A | 10/2000 | Otsuki et al. |
| 6,140,154 A | 10/2000 | Hinkle et al. |
| 6,143,981 A | 11/2000 | Glenn |
| 6,160,705 A | 12/2000 | Stearns et al. |
| 6,169,329 B1 | 1/2001 | Farnworth et al. |
| 6,172,419 B1 | 1/2001 | Kinsman |
| 6,175,087 B1 | 1/2001 | Keesler et al. |
| 6,177,718 B1 | 1/2001 | Kozono |
| 6,181,002 B1 | 1/2001 | Juso et al. |

(56) References Cited

U.S. PATENT DOCUMENTS

| | | |
|---|---|---|
| 6,184,463 B1 | 2/2001 | Panchou et al. |
| 6,184,465 B1 | 2/2001 | Corisis |
| 6,184,573 B1 | 2/2001 | Pu |
| 6,194,250 B1 | 2/2001 | Melton et al. |
| 6,194,777 B1 | 2/2001 | Abbott et al. |
| 6,197,615 B1 | 3/2001 | Song et al. |
| 6,198,171 B1 | 3/2001 | Huano et al. |
| 6,201,186 B1 | 3/2001 | Daniels et al. |
| 6,201,292 B1 | 3/2001 | Yagi et al. |
| 6,204,453 B1 | 3/2001 | Fallon et al. |
| 6,204,554 B1 | 3/2001 | Ewer et al. |
| 6,208,020 B1 | 3/2001 | Minamio et al. |
| 6,208,021 B1 | 3/2001 | Ohuchi et al. |
| 6,208,023 B1 | 3/2001 | Nakayama et al. |
| 6,211,462 B1 | 4/2001 | Carter, Jr. et al. |
| 6,214,525 B1 | 4/2001 | Boyko et al. |
| 6,214,641 B1 | 4/2001 | Akram |
| 6,218,731 B1 | 4/2001 | Huang et al. |
| 6,222,258 B1 | 4/2001 | Asano et al. |
| 6,222,259 B1 | 4/2001 | Park et al. |
| 6,225,146 B1 | 5/2001 | Yamaouchi et al. |
| 6,229,200 B1 | 5/2001 | Mclellan et al. |
| 6,229,205 B1 | 5/2001 | Jeong et al. |
| 6,235,554 B1 | 5/2001 | Akram et al. |
| 6,239,367 B1 | 5/2001 | Hsuan et al. |
| 6,239,384 B1 | 5/2001 | Smith et al. |
| 6,239,485 B1 | 5/2001 | Peters et al. |
| 6,242,281 B1 | 6/2001 | Mclellan et al. |
| 6,256,200 B1 | 7/2001 | Lam et al. |
| 6,258,192 B1 | 7/2001 | Nataraian |
| 6,258,629 B1 | 7/2001 | Niones et al. |
| 6,261,918 B1 | 7/2001 | So |
| 6,274,821 B1 | 8/2001 | Echigo et al. |
| 6,280,641 B1 | 8/2001 | Gaku et al. |
| 6,281,566 B1 | 8/2001 | Magni |
| 6,281,568 B1 | 8/2001 | Glenn et al. |
| 6,282,095 B1 | 8/2001 | Houghton et al. |
| 6,285,075 B1 | 9/2001 | Combs et al. |
| 6,291,271 B1 | 9/2001 | Lee et al. |
| 6,291,273 B1 | 9/2001 | Miyaki et al. |
| 6,294,100 B1 | 9/2001 | Fan et al. |
| 6,294,830 B1 | 9/2001 | Fjelstad |
| 6,295,977 B1 | 10/2001 | Ripper et al. |
| 6,297,548 B1 | 10/2001 | Moden et al. |
| 6,303,984 B1 | 10/2001 | Corisis |
| 6,303,997 B1 | 10/2001 | Lee |
| 6,307,272 B1 | 10/2001 | Takahashi et al. |
| 6,309,909 B1 | 10/2001 | Ohgiyama |
| 6,316,285 B1 | 11/2001 | Jiang et al. |
| 6,316,822 B1 | 11/2001 | Venkatashwaran et al. |
| 6,316,838 B1 | 11/2001 | Ozawa et al. |
| 6,323,550 B1 | 11/2001 | Martin et al. |
| 6,326,243 B1 | 12/2001 | Suzuya et al. |
| 6,326,244 B1 | 12/2001 | Brooks et al. |
| 6,326,678 B1 | 12/2001 | Kamezos et al. |
| 6,335,564 B1 | 1/2002 | Pour |
| 6,337,510 B1 | 1/2002 | Chun-Jen et al. |
| 6,339,255 B1 | 1/2002 | Shin |
| 6,348,726 B1 | 2/2002 | Bayan et al. |
| 6,351,031 B1 | 2/2002 | Iijima et al. |
| 6,353,999 B1 | 3/2002 | Cheng |
| 6,355,502 B1 | 3/2002 | Kang et al. |
| 6,365,974 B1 | 4/2002 | Abbott et al. |
| 6,365,975 B1 | 4/2002 | DiStefano et al. |
| 6,369,447 B2 | 4/2002 | Mori |
| 6,369,454 B1 | 4/2002 | Chuna |
| 6,373,127 B1 | 4/2002 | Baudouin et al. |
| 6,376,906 B1 | 4/2002 | Asai et al. |
| 6,380,048 B1 | 4/2002 | Boon et al. |
| 6,384,472 B1 | 5/2002 | Huang |
| 6,388,336 B1 | 5/2002 | Venkateshwaran et al. |
| 6,392,160 B1 | 5/2002 | Andry et al. |
| 6,395,578 B1 | 5/2002 | Shin et al. |
| 6,396,148 B1 | 5/2002 | Eichelberger et al. |
| 6,396,153 B2 | 5/2002 | Fillion et al. |
| 6,400,004 B1 | 6/2002 | Fan et al. |
| 6,405,431 B1 | 6/2002 | Shin et al. |
| 6,406,942 B2 | 6/2002 | Honda |
| 6,407,341 B1 | 6/2002 | Anstrom et al. |
| 6,407,930 B1 | 6/2002 | Hsu |
| 6,410,979 B2 | 6/2002 | Abe |
| 6,414,385 B1 | 7/2002 | Huang et al. |
| 6,420,779 B1 | 7/2002 | Sharma et al. |
| 6,429,508 B1 | 8/2002 | Gang |
| 6,437,429 B1 | 8/2002 | Su et al. |
| 6,444,499 B1 | 9/2002 | Swiss et al. |
| 6,448,510 B1 | 9/2002 | Neftin et al. |
| 6,448,633 B1 | 9/2002 | Yee et al. |
| 6,451,509 B2 | 9/2002 | Keesler et al. |
| 6,452,279 B2 | 9/2002 | Shimoda |
| 6,459,148 B1 | 10/2002 | Chun-Jen et al. |
| 6,464,121 B2 | 10/2002 | Reijnders |
| 6,476,469 B2 | 11/2002 | Hung et al. |
| 6,476,474 B1 | 11/2002 | Hung |
| 6,479,762 B2 | 11/2002 | Kusaka |
| 6,482,680 B1 | 11/2002 | Khor et al. |
| 6,497,943 B1 | 12/2002 | Jimarez et al. |
| 6,498,099 B1 | 12/2002 | McLellan et al. |
| 6,498,392 B2 | 12/2002 | Azuma |
| 6,507,096 B2 | 1/2003 | Gang |
| 6,507,120 B2 | 1/2003 | Lo et al. |
| 6,517,995 B1 | 2/2003 | Jacobson et al. |
| 6,521,530 B2 | 2/2003 | Peters et al. |
| 6,524,885 B2 | 2/2003 | Pierce |
| 6,534,391 B1 | 3/2003 | Huemoeller et al. |
| 6,534,849 B1 | 3/2003 | Gang |
| 6,544,638 B2 | 4/2003 | Fischer et al. |
| 6,545,332 B2 | 4/2003 | Huana |
| 6,545,345 B1 | 4/2003 | Glenn et al. |
| 6,559,525 B2 | 5/2003 | Huang |
| 6,566,168 B2 | 5/2003 | Gang |
| 6,583,503 B2 | 6/2003 | Akram et al. |
| 6,586,682 B2 | 7/2003 | Strandbera |
| 6,593,645 B2 | 7/2003 | Shih et al. |
| 6,603,196 B2 | 8/2003 | Lee et al. |
| 6,608,757 B1 | 8/2003 | Bhatt et al. |
| 6,624,005 B1 | 9/2003 | DiCaprio et al. |
| 6,660,559 B1 | 12/2003 | Huemoeller et al. |
| 6,667,546 B2 | 12/2003 | Huang et al. |
| 6,671,398 B2 | 12/2003 | Reinhorn et al. |
| 6,715,204 B1 | 4/2004 | Tsukada et al. |
| 6,727,576 B2 | 4/2004 | Hedler et al. |
| 6,727,645 B2 | 4/2004 | Tsujimura et al. |
| 6,730,857 B2 | 5/2004 | Konrad et al. |
| 6,734,542 B2 | 5/2004 | Nakatani et al. |
| 6,740,964 B2 | 5/2004 | Sasaki |
| 6,753,612 B2 | 6/2004 | Adae-Amoakoh et al. |
| 6,774,748 B1 | 8/2004 | Ito et al. |
| 6,787,443 B1 | 9/2004 | Boggs et al. |
| 6,803,528 B1 | 10/2004 | Koyanaai |
| 6,815,709 B2 | 11/2004 | Clothier et al. |
| 6,815,739 B2 | 11/2004 | Huff et al. |
| 6,830,958 B2 | 12/2004 | Makimoto |
| 6,831,371 B1 | 12/2004 | Huemoeller et al. |
| 6,838,776 B2 | 1/2005 | Leal et al. |
| 6,845,554 B2 | 1/2005 | Frankowsky et al. |
| 6,884,717 B1 | 4/2005 | Desalvo et al. |
| 6,888,240 B2 | 5/2005 | Towle et al. |
| 6,905,914 B1 | 6/2005 | Huemoeller et al. |
| 6,919,514 B2 | 7/2005 | Konrad et al. |
| 6,921,968 B2 | 7/2005 | Chung |
| 6,921,975 B2 | 7/2005 | Leal et al. |
| 6,930,256 B1 | 8/2005 | Huemoeller et al. |
| 6,931,726 B2 | 8/2005 | Boyko et al. |
| 6,936,525 B2 | 8/2005 | Nishiyama et al. |
| 6,948,944 B2 | 9/2005 | Ueno |
| 6,953,995 B2 | 10/2005 | Farnworth et al. |
| 7,015,075 B2 | 3/2006 | Fay et al. |
| 7,030,469 B2 | 4/2006 | Mahadevan et al. |
| 7,041,534 B2 | 5/2006 | Chao et al. |
| 7,081,661 B2 | 7/2006 | Takehara et al. |
| 7,125,744 B2 | 10/2006 | Takehara et al. |
| 7,129,158 B2 | 10/2006 | Nakai |
| 7,185,426 B1 | 3/2007 | Hiner et al. |

(56) References Cited

U.S. PATENT DOCUMENTS

| | | |
|---|---|---|
| 7,190,062 B1 | 3/2007 | Sheridan et al. |
| 7,192,807 B1 | 3/2007 | Huemoeller et al. |
| 7,198,980 B2 | 4/2007 | Jiang et al. |
| 7,202,107 B2 | 4/2007 | Fuergut et al. |
| 7,242,081 B1 | 7/2007 | Lee |
| 7,247,523 B1 | 7/2007 | Huemoeller et al. |
| 7,272,444 B2 | 9/2007 | Peterson et al. |
| 7,282,394 B2 | 10/2007 | Cho et al. |
| 7,285,855 B2 | 10/2007 | Foong |
| 7,345,361 B2 | 3/2008 | Maliik et al. |
| 7,361,533 B1 | 4/2008 | Huemoeller et al. |
| 7,372,151 B1 | 5/2008 | Fan et al. |
| 7,420,272 B1 | 9/2008 | Huemoeller et al. |
| 7,429,786 B2 | 9/2008 | Kamezos et al. |
| 7,459,202 B2 | 12/2008 | Magera et al. |
| 7,548,430 B1 | 6/2009 | Huemoeller et al. |
| 7,550,857 B1 | 6/2009 | Longo et al. |
| 7,572,681 B1 | 8/2009 | Huemoeller et al. |
| 7,618,846 B1 | 11/2009 | Pagaila et al. |
| 7,633,765 B1 | 12/2009 | Scanlan et al. |
| 7,671,457 B1 | 3/2010 | Hiner et al. |
| 7,692,286 B1 | 4/2010 | Huemoeller et al. |
| 7,714,431 B1 | 5/2010 | Huemoeller et al. |
| 7,723,210 B2 | 5/2010 | Berry et al. |
| 7,759,163 B2 | 7/2010 | Kroeninger et al. |
| 7,777,351 B1 | 8/2010 | Berry et al. |
| 7,825,520 B1 | 11/2010 | Longo et al. |
| 7,902,660 B1 | 3/2011 | Lee et al. |
| 7,960,827 B1 | 6/2011 | Miller et al. |
| 7,977,163 B1 | 7/2011 | Huemoeller et al. |
| 8,018,068 B1 | 9/2011 | Scanlan et al. |
| 8,101,460 B2 | 2/2012 | Pagaila |
| 8,341,835 B1 | 1/2013 | Huemoeller et al. |
| 8,796,561 B1 | 8/2014 | Scanlan et al. |
| 8,937,381 B1 | 1/2015 | Dunlap et al. |
| 9,691,734 B1 | 6/2017 | Dunlap |
| 2001/0008305 A1 | 7/2001 | McLellan et al. |
| 2001/0011654 A1 | 8/2001 | Schmidt et al. |
| 2001/0012704 A1 | 8/2001 | Eldridge |
| 2001/0014538 A1 | 8/2001 | Kwan et al. |
| 2002/0017712 A1 | 2/2002 | Bessho et al. |
| 2002/0024122 A1 | 2/2002 | Jung et al. |
| 2002/0027297 A1 | 3/2002 | Ikenaga et al. |
| 2002/0061642 A1 | 5/2002 | Haji et al. |
| 2002/0066952 A1 | 6/2002 | Taniguchi et al. |
| 2002/0140061 A1 | 10/2002 | Lee |
| 2002/0140068 A1 | 10/2002 | Lee et al. |
| 2002/0142514 A1* | 10/2002 | Scheifers ............... H01L 21/56 438/107 |
| 2002/0149298 A1 | 10/2002 | Furukawa et al. |
| 2002/0159242 A1 | 10/2002 | Nakatani et al. |
| 2002/0163015 A1 | 11/2002 | Lee et al. |
| 2002/0195697 A1 | 12/2002 | Mess et al. |
| 2003/0013232 A1 | 1/2003 | Towle et al. |
| 2003/0025199 A1 | 2/2003 | Wu et al. |
| 2003/0030131 A1 | 2/2003 | Lee et al. |
| 2003/0064548 A1 | 4/2003 | Isaak |
| 2003/0073265 A1 | 4/2003 | Hu et al. |
| 2003/0128096 A1 | 7/2003 | Mazzochette |
| 2003/0134455 A1 | 7/2003 | Cheng et al. |
| 2003/0141582 A1 | 7/2003 | Yang et al. |
| 2003/0197284 A1 | 10/2003 | Khiang et al. |
| 2004/0004293 A1 | 1/2004 | Murayama |
| 2004/0026781 A1 | 2/2004 | Nakai |
| 2004/0046244 A1 | 3/2004 | Nakamura et al. |
| 2004/0056277 A1 | 3/2004 | Kamezos |
| 2004/0061212 A1 | 4/2004 | Kamezos |
| 2004/0061213 A1 | 4/2004 | Kamezos |
| 2004/0063242 A1 | 4/2004 | Kamezos |
| 2004/0063246 A1 | 4/2004 | Kamezos |
| 2004/0113260 A1 | 6/2004 | Sunohara et al. |
| 2004/0145044 A1 | 7/2004 | Sugaya et al. |
| 2004/0159462 A1 | 8/2004 | Chung |
| 2005/0139985 A1 | 6/2005 | Takahashi |
| 2005/0242425 A1 | 11/2005 | Leal et al. |
| 2005/0282314 A1 | 12/2005 | Lo et al. |
| 2006/0231233 A1 | 10/2006 | Farid et al. |
| 2007/0273049 A1 | 11/2007 | Khan et al. |
| 2007/0281471 A1 | 12/2007 | Hurwitz et al. |
| 2007/0290376 A1 | 12/2007 | Zhao et al. |
| 2008/0012144 A1 | 1/2008 | Meyer |
| 2008/0230887 A1 | 9/2008 | Sun et al. |
| 2009/0261468 A1 | 10/2009 | Kroeninger et al. |
| 2010/0044885 A1 | 2/2010 | Fuergut et al. |
| 2010/0203676 A1 | 8/2010 | Theuss et al. |

FOREIGN PATENT DOCUMENTS

| | | |
|---|---|---|
| EP | 0 459 493 | 12/1991 |
| EP | 0 720 225 | 7/1996 |
| EP | 0 720 234 | 7/1996 |
| EP | 0 794 572 | 9/1997 |
| EP | 0 844 665 | 5/1998 |
| EP | 0 936 671 | 8/1999 |
| EP | 0 989 608 | 3/2000 |
| EP | 1 032 037 | 8/2000 |
| JP | 55-163868 | 12/1980 |
| JP | 57-045959 | 3/1982 |
| JP | 59-208756 | 11/1984 |
| JP | 59-227143 | 12/1984 |
| JP | 60-010756 | 1/1985 |
| JP | 60-116239 | 6/1985 |
| JP | 60-195957 | 10/1985 |
| JP | 60-231349 | 11/1985 |
| JP | 61-039555 | 2/1986 |
| JP | 62-009639 | 1/1987 |
| JP | 63-033854 | 2/1988 |
| JP | 63-067762 | 3/1988 |
| JP | 63-188964 | 8/1988 |
| JP | 63-205935 | 8/1988 |
| JP | 63-233555 | 8/1988 |
| JP | 63-249345 | 9/1988 |
| JP | 63-289951 | 9/1988 |
| JP | 63-316470 | 11/1988 |
| JP | 64-054749 | 3/1989 |
| JP | 01-106456 | 4/1989 |
| JP | 01-175250 | 7/1989 |
| JP | 01-205544 | 8/1989 |
| JP | 01-251747 | 10/1989 |
| JP | 02-129948 | 5/1990 |
| JP | 03-069248 | 7/1991 |
| JP | 03-177060 | 8/1991 |
| JP | 04-098864 | 3/1992 |
| JP | 05-109975 | 4/1993 |
| JP | 05-129473 | 5/1993 |
| JP | 05-136323 | 6/1993 |
| JP | 5166992 | 7/1993 |
| JP | 05-283460 | 10/1993 |
| JP | 06-092076 | 4/1994 |
| JP | 06-140563 | 5/1994 |
| JP | 06-260532 | 9/1994 |
| JP | 07-017175 | 1/1995 |
| JP | 07-297344 | 11/1995 |
| JP | 07-312405 | 11/1995 |
| JP | 08-064634 | 3/1996 |
| JP | 08-083877 | 3/1996 |
| JP | 08-125066 | 5/1996 |
| JP | 08-190615 | 7/1996 |
| JP | 08-222682 | 8/1996 |
| JP | 08-306853 | 11/1996 |
| JP | 09-008205 | 1/1997 |
| JP | 09-008206 | 1/1997 |
| JP | 09-008207 | 1/1997 |
| JP | 09-092775 | 4/1997 |
| JP | 09-293822 | 11/1997 |
| JP | 10-022447 | 1/1998 |
| JP | 10-163401 | 6/1998 |
| JP | 10-199934 | 7/1998 |
| JP | 10-256240 | 9/1998 |
| JP | 10-334205 | 12/1998 |
| JP | 2000-150765 | 5/2000 |
| JP | 2000-556398 | 10/2000 |
| JP | 2001-060648 | 3/2001 |
| JP | 2002-043497 | 2/2002 |

(56) References Cited

FOREIGN PATENT DOCUMENTS

| | | |
|---|---|---|
| JP | 2008-285593 | 11/2008 |
| KR | 1994-0001979 | 1/1994 |
| KR | 10-0220154 | 6/1999 |
| KR | 2002-0049944 | 6/2002 |
| WO | 99/56316 | 11/1999 |
| WO | 99/67821 | 12/1999 |

OTHER PUBLICATIONS

Kim et al., "Application ofThrough Mold Via (TMV) as PoP base package", 58th ECTC Proceedings, May 2008, Lake Buena Vista, FL, 6 pages, IEEE.
Scanlan, "Package-on-package (PoP) with Through-mold Vias", Advanced Packaging, Jan. 2008, 3 pages, vol. 17, Issue 1, PennWell Corporation.
S.W. Youn et al., Microstructuring of 45 11m-Deep Dual Damascene Openings in SU-8/Si by UV-Assisted Thermal Imprinting with Opaque Mold, Jpn. J. Appl. Phys. 48 (2009) 06FH09.
Huemoeller et al., "Integrated Circuit Film Substrate Having Embedded Conductive Patterns and Vias", U.S. Appl. No. 10/261,868, filed Oct. 1, 2002.
Hiner et al., "Printed Wiring Motherboard Having Bonded Interconnect Redistribution Mesa", U.S. Appl. No. 10/992,371, filed Nov. 18, 2004.
Berry et al., "Direct-Write Wafer Level Chip Scale Package", U.S. Appl. No. 11/289,826, filed Nov. 29, 2005.
Hue Moeller et al., "Build Up Motherboard Fabrication Method and Structure", U.S. Appl. No. 11/824,395, filed Jun. 29, 2007.
Dunlap et al., "Thin Stackable Package and Method", U.S. Appl. No. 12/630,586, filed Dec. 3, 2009.

\* cited by examiner

Mold compound lamination electronic component package fabrication method 100

METHOD OF FORMING A PLURALITY OF ELECTRONIC COMPONENT PACKAGES

CROSS-REFERENCE TO RELATED APPLICATIONS/INCORPORATION BY REFERENCE

The present application is a continuation of copending U.S. patent application Ser. No. 12/632,170, filed on Dec. 7, 2009, and titled "MOLD COMPOUND LAMINATION ELECTRONIC COMPONENT PACKAGE FORMATION METHOD," expected to issue as U.S. Pat. No. 9,691,734, which is hereby incorporated herein by reference in its entirety for all purposes.

BACKGROUND OF THE INVENTION

Field of the Invention

The present application relates to the field of electronics, and more particularly, to methods of forming electronic component packages and related structures.

Description of the Related Art

Electronic component packages are fabricated in an array to minimize fabrication cost. Initially, electronic components are mounted face down to a carrier. The electronic components are then molded by injecting molding compound around the electronic components.

During the molding process, the electronic components are often moved and displaced due to the force of the injected molding compound. This misalignment of the electronic components results in loss of yield thus increasing the overall cost of each electronic component package.

SUMMARY OF THE INVENTION

A method of forming a plurality of electronic component packages includes attaching electronic components to a carrier, wherein high aspect ratio spaces exist between the electronic components. A dielectric sheet is laminated around the electronic components thus filling the spaces and forming a package body. The spaces are completely and reliably filled by the dielectric sheet and thus the package body has an absence of voids. Further, an upper surface of the package body is planar, i.e., has an absence of ripples or other non-uniformities. Further, lamination of the dielectric sheet is performed with a low cost lamination system.

These and other features of the present invention will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

Figure 2:
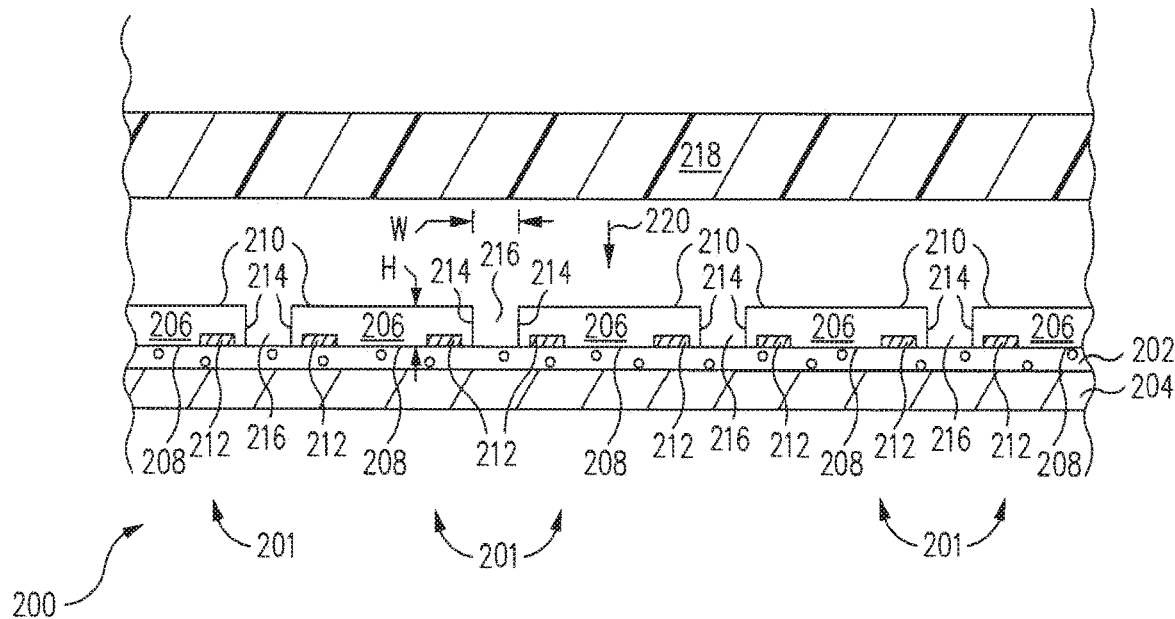
FIG. 2 is a cross-sectional view of an array during the fabrication of a plurality of electronic component packages in accordance with one embodiment.
Figure 3:
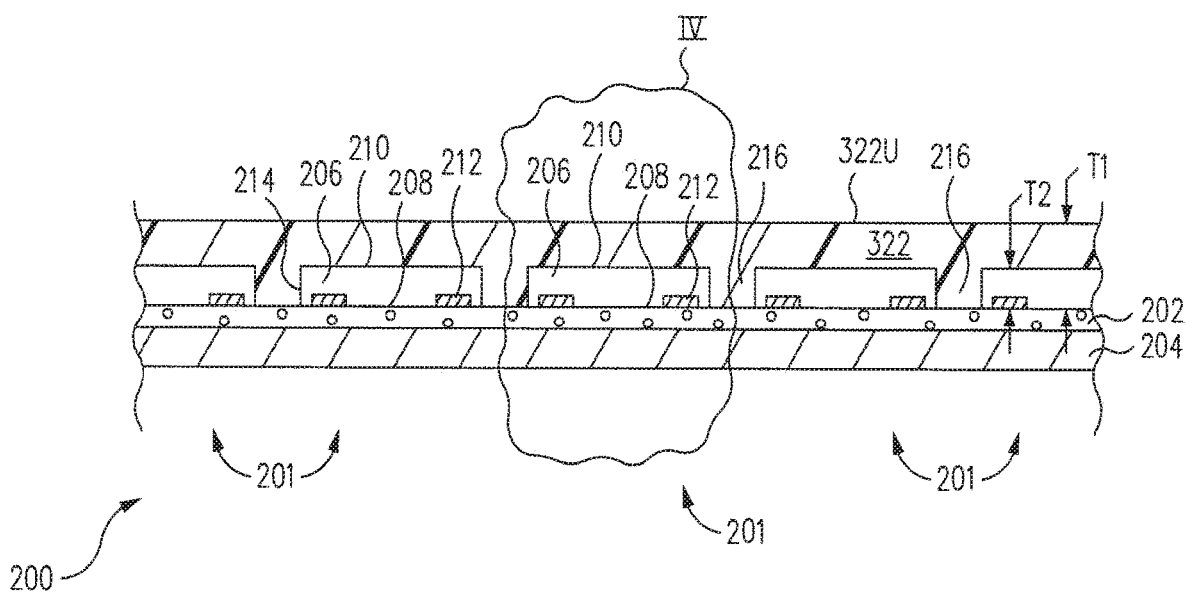
FIG. 3 is a cross-sectional view of the array of FIG. 2 at a later stage during fabrication in accordance with one embodiment.
Figure 4:
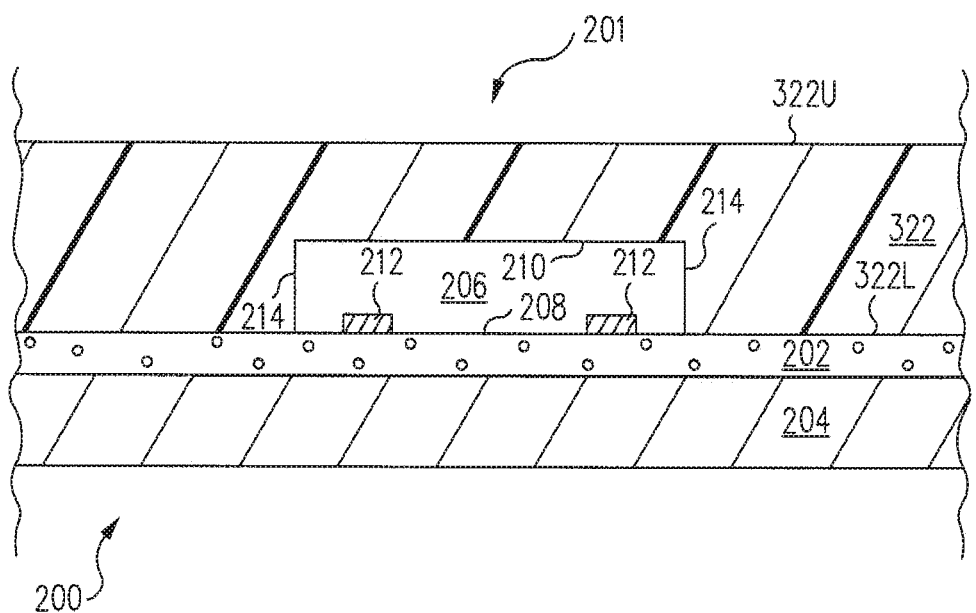
FIG. 4 is an enlarged cross-section view of the region IV of the array of FIG. 3.

As an overview, referring to FIGS. 2, 3, and 4 together, electronic components 206 are attached to a carrier 204, wherein high aspect ratio spaces 216 exist between electronic components 206. A dielectric sheet 218 (FIG. 2) is laminated around electronic components 206 thus filling spaces 216 and forming a package body 322 (FIGS. 3, 4). Spaces 216 are completely and reliably filled by dielectric sheet 218 and thus package body 322 has an absence of voids. Further, an upper surface 322U of package body 322 is planar, i.e., has an absence of ripples or other non-uniformities. Further, lamination of dielectric sheet 218 is performed with a low cost lamination system.

Figure 1:
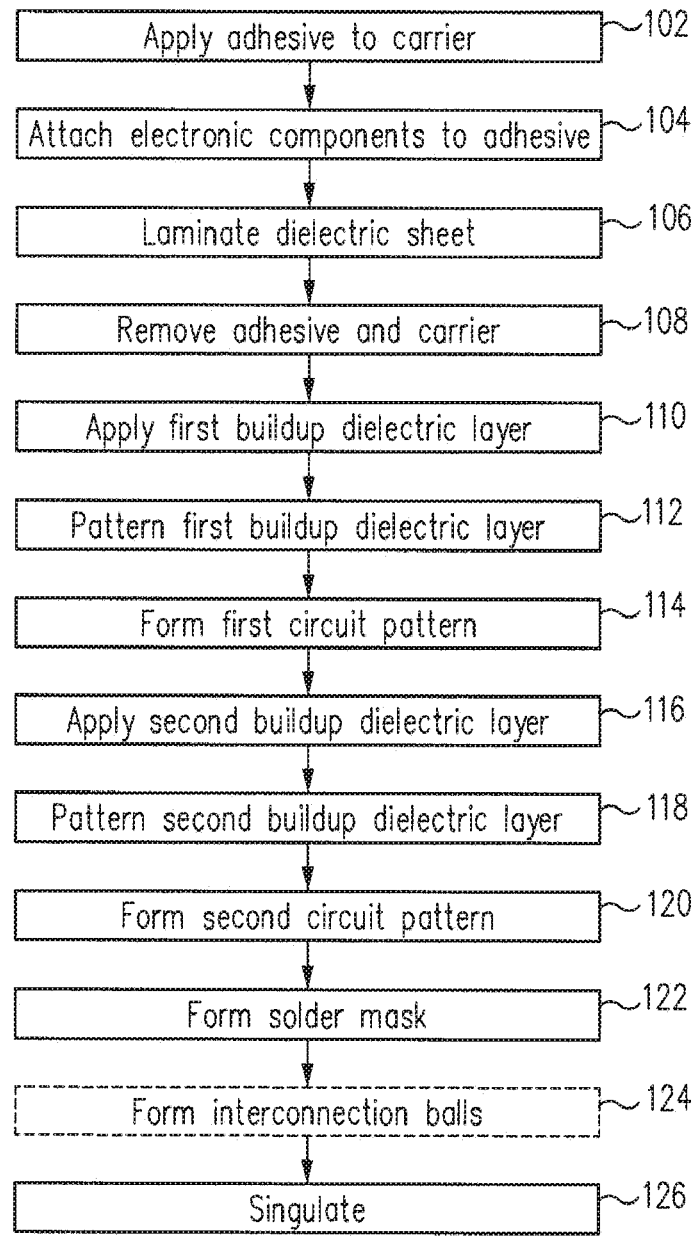
FIG. 1 is a block diagram of a mold compound lamination electronic component package fabrication method in accordance with one embodiment.

Now in more detail, FIG. 1 is a block diagram of a mold compound lamination electronic component package fabrication method 100 in accordance with one embodiment. FIG. 2 is a cross-sectional view of an array 200 during the fabrication of a plurality of electronic component packages 201 in accordance with one embodiment. Referring now to FIGS. 1 and 2, in an apply adhesive to carrier operation 102, an adhesive 202 is applied to a carrier 204, sometimes called a support panel. In one embodiment, after application, adhesive 202 is cut to conform to the shape of carrier 204.

From apply adhesive to carrier operation 102, flow moves to an attach electronic components to adhesive operation 104. In attach electronic components to adhesive operation 104, electronic components 206 are mounted to adhesive 202, and generally to carrier 204.

In one embodiment, electronic components 206 are integrated circuit chips, e.g., active components. However, in other embodiments, electronic components 206 are passive components such as capacitors, resistors, or inductors.

In accordance with this embodiment, electronic components 206 include active surfaces 208 and opposite inactive surfaces 210. Electronic components 206 further includes bond pads 212 formed on active surfaces 208 and sides 214 extending between active surfaces 208 and inactive surfaces 210.

Active surfaces 208 of electronic components 206 are pressed into adhesive 202 on carrier 204 and thus stick to carrier 204 by adhesive 202.

In one embodiment, die processing operations are performed on electronic components 206 prior to attachment to adhesive 202. Illustratively, electronic components 206 are probed to verify the integrity of electronic components 206 while still in wafer form. The wafer of electronic components 206 is mounted in a wafer singulation apparatus, singulated, e.g., sawed, and cleaned. A bar-code label is applied to electronic components 206 and they are optically inspected to verify the integrity of electronic components 206.

In one embodiment, the aspect ratio of spaces 216 between electronic components 206 is relatively high. The aspect ratio is defined as the ratio of the height H of a space 216 to the width W of a space 216.

Illustratively, height H is in the range of 400 micrometers (400 μm) to 500 μm and width W is 100 μm. Stated another way, the distance between electronic components 206 is 100 μm and the thickness or height of electronic components 206 between active surfaces 208 and inactives surface 210 is in the range of 400 µm to 500 µm. Although various dimensions are provided herein, in light of this disclosure, it is to be understood that the dimensions may not be exact, but only substantially exact to within accepted manufacturing tolerances.

Although attachment of single electronic components 206 is illustrated and discussed, in other embodiments, each electronic component package 201 includes multiple electronic components, e.g., in a side-by-side arrangement, a stacked arrangement, a System in Package (SIP) with passives arrangement, or a Package on Package (PoP) arrangement.

From attach electronic components to adhesive operation 204, flow moves to a laminate dielectric sheet operation 106. In laminate dielectric sheet operation 106, a dielectric sheet 218 is laminated around electronic components 206.

More particularly, dielectric sheet 218 is located above electronic components 206 as illustrated in FIG. 2. Dielectric sheet 218 is moved downward onto electronic components 206 as indicated by the arrow 220.

In one embodiment, dielectric sheet 218 is formed of mold compound, e.g., in a rectangular, or disc, e.g., circular, form. Using a lamination system, dielectric sheet 218 is pressed downward onto electronic components 206 while dielectric sheet 218, or the entire array 200, is heated to cause dielectric sheet 218 to flow, i.e., to have a sufficiently low viscosity to conform around electronic components 206. Dielectric sheet 218 flows around electronic components 206 and to adhesive 202 filling spaces 216 between electronic components 202. In one embodiment, after lamination, dielectric sheet 218 is cut to conform to the shape of carrier 204.

FIG. 3 is a cross-sectional view of array 200 of FIG. 2 at a later stage during fabrication in accordance with one embodiment. FIG. 4 is an enlarged cross-section view of the region IV of array 200 of FIG. 3. Referring now to FIGS. 1, 2, 3, and 4 together, after lamination of dielectric sheet 218, dielectric sheet 218 forms a dielectric package body 322 as illustrated in FIGS. 3, 4.

Spaces 216 are completely and reliably filled by dielectric sheet 218 and thus package body 322 has an absence of voids. Further, an upper, e.g., first surface 322U of package body 322 is planar, i.e., has an absence of ripples or other non-uniformities. Further, lamination of dielectric sheet 218 is performed with a low cost lamination system. Accordingly, lamination of dielectric sheet 218 is performed at a relatively low cost, e.g., with a low capital expenditure.

As set forth above, the aspect ratio of spaces 216 is high. Using a lamination process, spaces 216 are reliably filled with package body 322 while also providing a planar upper surface 322U.

In contrast, the inventor has discovered that applying a dielectric layer using a spin coating technique produces a dielectric layer having substantial non-uniformity for high aspect ratio spaces. More particularly, the upper surface of the spin coating applied dielectric layer includes radiating ripples in a spoke wheel type pattern. Non-uniformity of the dielectric layer is undesirable.

The inventor has also discovered that applying a dielectric layer using a stencil printing method, sometimes called a printing method, forms voids within the dielectric material for high aspect ratio spaces. These voids are formed from out gassing from the dielectric material as the dielectric material cures. Further, as the dielectric material cures, the dielectric material shrinks resulting in undesirable shifting and moving of the electronic components. The formation of voids and electronic component shift is undesirable.

In the case where mold compound is injected around the electronic components, the electronic components are often moved and displaced due to the force of the injected molding compound. Further, molding equipment is relatively expensive thus increasing the capital expenditure necessary to produce the electronic component packages.

Paying particular attention now to FIGS. 3, 4, package body 322 includes a lower, e.g., second, surface 322L attached to adhesive 202. Package body 322 completely encloses electronic components 206 including inactive surfaces 210 and sides 214 and the exposed portion of adhesive 202. Lower surface 322L is coplanar with active surfaces 208 of electronic components 206.

Package body 322 is thicker having a thickness T1 greater than a thickness T2 of electronic components 206. More particularly, upper surface 322U of package body 322 is above and spaced apart from inactive surfaces 210 such that inactive surfaces 210 are covered in package body 322.

In one embodiment, package body 322 is ground down from upper surface 322U to expose inactive surfaces 210 of electronic components 206. In one embodiment, inactive surfaces 210 are also ground down thus thinning both package body 322 and electronic components 206.

Figure 5:
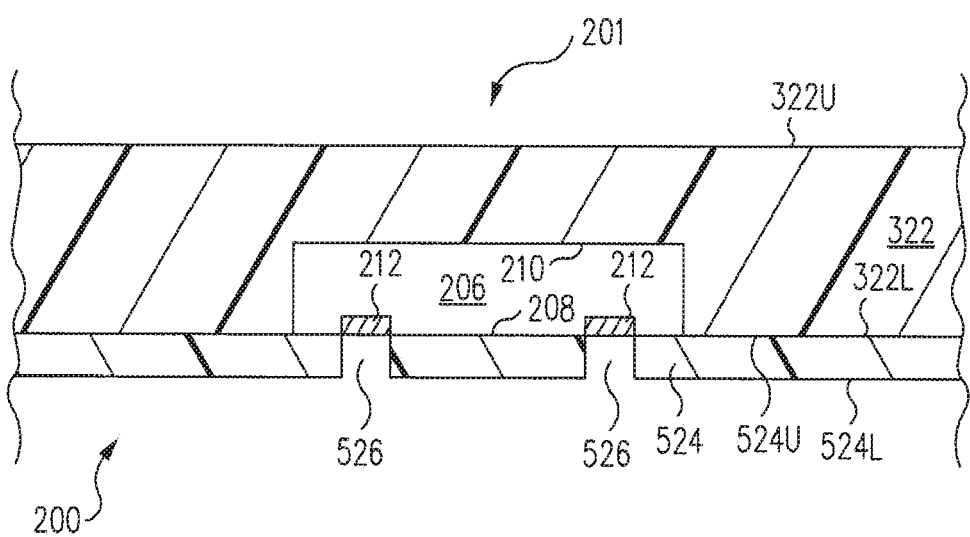
FIGS. 5, 6, 7, 8, 9 are cross-section views of the array of FIG. 4 at later stages during fabrication in accordance with various embodiments.

FIG. 5 is a cross-section view of array 200 of FIG. 4 at a later stage during fabrication. Referring now to FIGS. 1, 4, and 5 together, from laminate dielectric sheet operation 106, flow moves to a remove adhesive and carrier operation 108. In remove adhesive and carrier operation 108, adhesive 202 and carrier 204 (see FIG. 4) are removed as illustrated in FIG. 5. Package body 322 is a relatively rigid material allowing adhesive 202 and carrier 204 to be removed. In various embodiments, adhesive 202 and carrier 204 are removed by peeling, etching, grinding, or other removal technique.

After removal of adhesive 202 and carrier 204, array 200 is sometimes called a reconstituted wafer. In various embodiments, dielectric sheet 218 (package body 322) is cured and/or cooled prior to or after removal of adhesive 202 and carrier 204 to harden dielectric sheet 218 (package body 322).

Referring now to FIGS. 1 and 5 together, from remove adhesive and carrier operation 108, flow moves to an apply first buildup dielectric layer operation 110. For simplicity, in the remaining figures, the operations will be discussed as being performed with a single electronic component 206 as illustrated. However, in light of this disclosure, those of skill in the art will understand that the operations are performed simultaneously to the plurality of electronic components 206 of array 200.

In apply first buildup dielectric layer operation 110, a first buildup dielectric layer 524 is applied to lower surface 322L of package body 322 and active surface 208 of electronic component 206 including bond pads 212. More particularly, an upper, e.g., first, surface 524U is applied to lower surface 322L of package body 322 and active surface 208 of electronic component 206. First buildup dielectric layer 524 further includes a lower, e.g., second, surface 524L.

From apply first buildup dielectric layer operation 110, flow moves to a patterned first buildup dielectric layer operation 112. In pattern first buildup dielectric layer operation 112, first buildup dielectric layer 524 is patterned to form bond pad via apertures 526 in first buildup dielectric layer 524.

Bond pad via apertures 526 are formed entirely through first buildup dielectric layer 524. Bond pad via apertures 526 extend through first buildup dielectric layer 524 and to bond pads 212. Bond pads 212 are exposed through bond pad via apertures 526.

Figure 6:
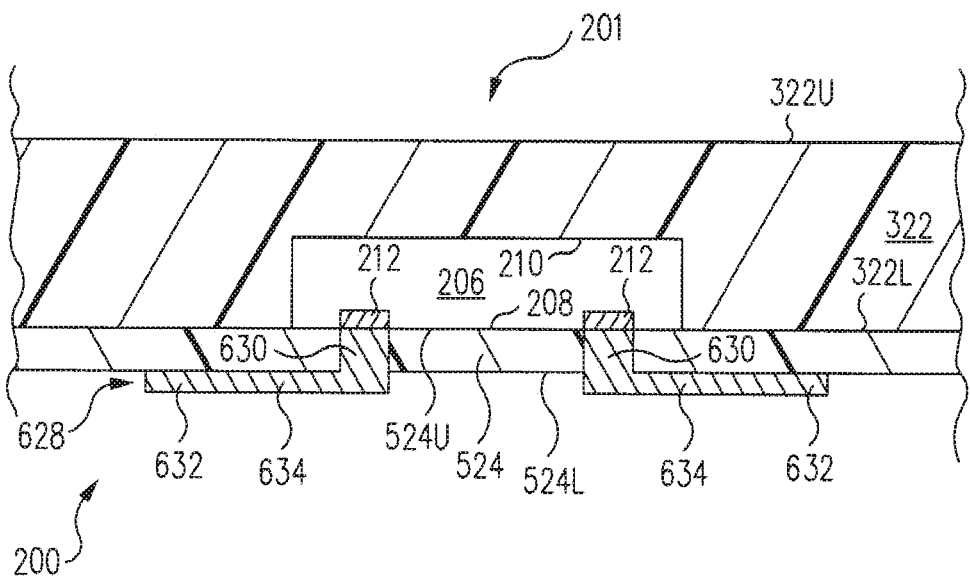

FIG. 6 is a cross-section view of array 200 of FIG. 5 at a later stage during fabrication. Referring now to FIGS. 1, 5, and 6 together, from pattern first buildup dielectric layer operation 112, flow moves to a form first circuit pattern operation 114. In form first circuit pattern operation 114, an electrically conductive first circuit pattern 628 is formed. First circuit pattern 628 is sometimes called a redistribution layer (RDL).

First circuit pattern 628 includes electrically conductive bond pad vias 630 formed within bond pad via apertures 526. Bond pad vias 630 are electrically connected to bond pads 212.

First circuit pattern 628 further includes electrically conductive lands 632 and electrically conductive traces 634. In accordance with this embodiment, lands 632 and traces 634 are formed on lower surface 524L of first buildup dielectric layer 524. Traces 634 electrically connect bond pad vias 630 with lands 632.

In one embodiment, first circuit pattern 628 is formed by plating an electrically conductive material such as copper. In one embodiment, a resist is applied to first buildup dielectric layer 524 and patterned to form a circuit pattern artifact therein, e.g., a positive image of first circuit pattern 628. The circuit pattern artifact formed within the resist is filled with the electrically conductive material to form first circuit pattern 628. The resist is then removed.

In another embodiment, an electrically conductive material is plated to cover first buildup dielectric layer 524. The electrically conductive material on first buildup dielectric layer 524 is then selectively etched to form first circuit pattern 628.

As set forth above, first circuit pattern 628, e.g., lands 632 and traces 634 thereof, is formed on lower surface 524L of first buildup dielectric layer 524. However, in another embodiment, first circuit pattern 628, e.g., lands 632 and traces 634 thereof, is embedded into first buildup dielectric layer 524 at lower surface 524L.

In accordance with this embodiment, a circuit pattern artifact, e.g., a positive image of first circuit pattern 628, is formed in first buildup dielectric layer 524 at lower surface 524L. The circuit pattern artifact is formed using laser ablation, for example.

The circuit pattern artifact formed within first buildup dielectric layer 524 is filled with the electrically conductive material to form first circuit pattern 628. First circuit pattern 628 is embedded within first buildup dielectric layer 524.

Figure 7:
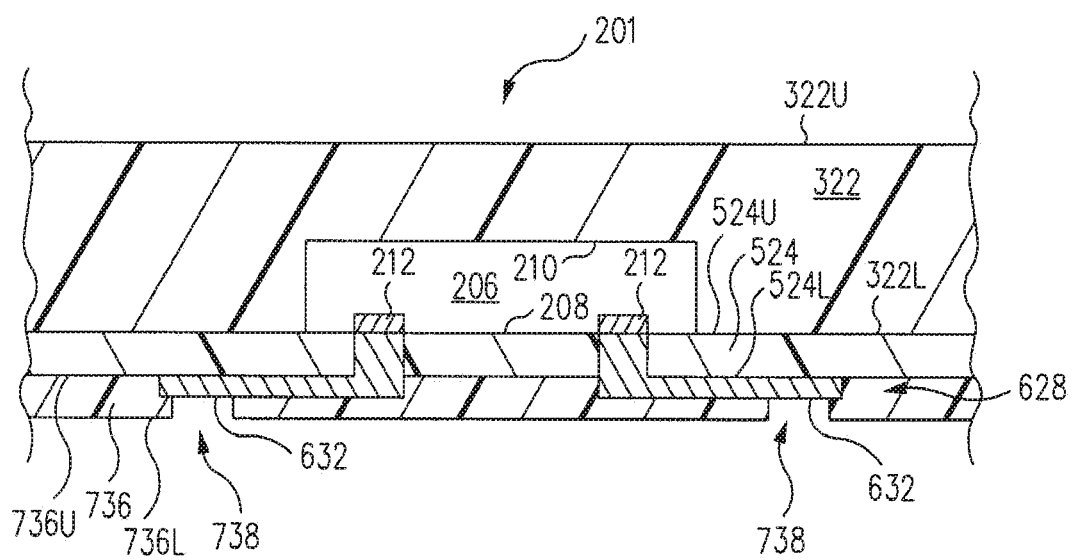

FIG. 7 is a cross-section view of array 200 of FIG. 6 at a later stage during fabrication. Referring now to FIGS. 1 and 7 together, from form first circuit pattern operation 114, flow moves to an apply second buildup dielectric layer operation 116. In apply second buildup dielectric layer operation 116, a second buildup dielectric layer 736 is applied to lower surface 524L of first buildup dielectric layer 524 and to first circuit pattern 628.

More particularly, an upper, e.g., first, surface 736U of second buildup dielectric layer 736 is applied to lower surface 524L of first buildup dielectric layer 524 and first circuit pattern 628. Second buildup dielectric layer 736 further includes a lower, e.g., second, surface 736L.

From apply second buildup dielectric layer operation 116, flow moves to a pattern second buildup dielectric layer operation 118. In pattern second buildup dielectric layer operation 118, second buildup dielectric layer 736 is patterned to form blind via apertures 738 in second buildup dielectric layer 736. Blind via apertures 738 extend entirely through second buildup dielectric layer 736 to expose first circuit pattern 628, e.g., lands 632 thereof. In one embodiment, blind via apertures 738 are formed by laser ablating through second buildup dielectric layer 736, although other blind via aperture formation techniques are used in other embodiments.

Figure 8:
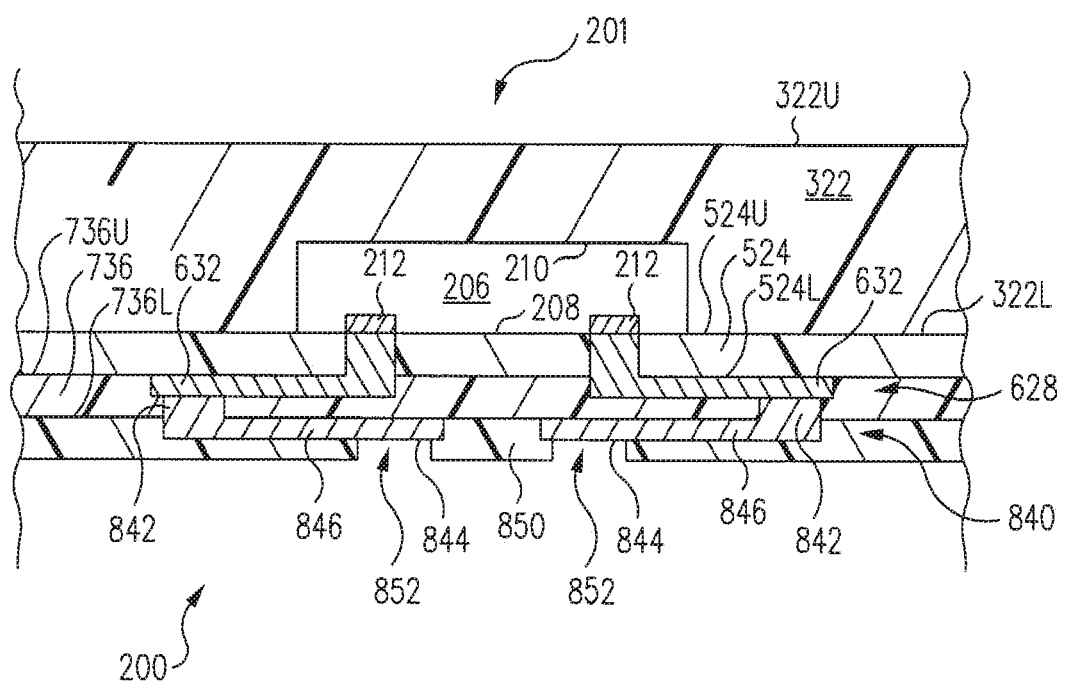

FIG. 8 is a cross-section view of array 200 of FIG. 7 at a later stage during fabrication. Referring now to FIGS. 1, 7, and 8 together, from pattern second buildup layer operation 118, flow moves to a form second circuit pattern operation 120. In form second circuit pattern operation 120, an electrically conductive second circuit pattern 840 is formed.

Second circuit pattern 840 includes electrically conductive blind vias 842 formed within blind via apertures 738. Blind vias 842 are electrically connected to first circuit pattern 628, e.g., lands 632 thereof.

Second circuit pattern 840 further includes electrically conductive lands 844 and electrically conductive traces 846. In accordance with this embodiment, lands 844 and traces 846 are formed on lower surface 736L of second buildup dielectric layer 736. Traces 846 electrically connect blind vias 842 with lands 844.

In one embodiment, second circuit pattern 840 is formed by plating an electrically conductive material such as copper. In one embodiment, a resist is applied to second buildup dielectric layer 736 and patterned to form a circuit pattern artifact therein, e.g., a positive image of second circuit pattern 840. The circuit pattern artifact formed within the resist is filled with the electrically conductive material to form second circuit pattern 840. The resist is then removed.

In another embodiment, an electrically conductive material is plated to fill blind via apertures 738 and to cover second buildup dielectric layer 736. The electrically conductive material on second buildup dielectric layer 736 is then selectively etched to form second circuit pattern 840.

As set forth above, second circuit pattern 840, e.g., lands 844 and traces 846 thereof, is formed on lower surface 736L of second buildup dielectric layer 736. However, in another embodiment, second circuit pattern 840, e.g., lands 844 and traces 846 thereof, is embedded into second buildup dielectric layer 736 at lower surface 736L.

In accordance with this embodiment, a circuit pattern artifact, e.g., a positive image of second circuit pattern 840, is formed in second buildup dielectric layer 736 at lower surface 736L. The circuit pattern artifact is formed using laser ablation, for example.

The circuit pattern artifact formed within second buildup dielectric layer 736 is filled with the electrically conductive material to form second circuit pattern 840. Second circuit pattern 840 is embedded within second buildup dielectric layer 736.

Although first circuit pattern 628 and second circuit pattern 840 are set forth as containing particular features, e.g., bond pad vias, lands, traces, and blind vias, in light of this disclosure, those of skill in the art will understand that circuit patterns can be formed with other and/or different features depending on the particular signal routing desired.

From form second circuit pattern operation 120, flow moves to a form solder mask operation 122. In form solder mask operation 122, a dielectric solder mask 850 is formed. More particularly, solder mask 850 is applied to lower surface 736L of second buildup dielectric layer 736 and second circuit pattern 840. Solder mask 850 is patterned to form land openings 852 in solder mask 850. Land openings 852 expose lands 844 of second circuit pattern 840.

Figure 9:
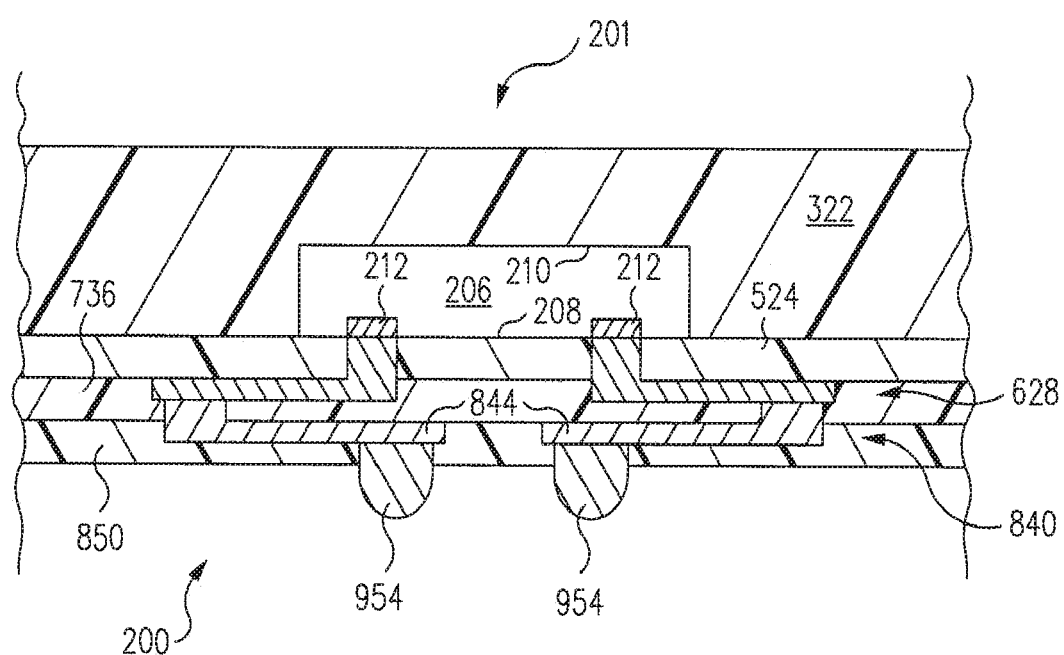

FIG. 9 is a cross-section view of array 200 of FIG. 8 at a later stage during fabrication. Referring now to FIGS. 1, 8, and 9 together, from form solder mask operation 122, flow moves, optionally, to a form interconnection balls operation 124. In form interconnection balls operation 124, interconnection balls 954, e.g., solder, are formed on lands 844 and in land openings 852 of solder mask 850. Interconnection balls 954 are distributed in a Ball Grid Array (BGA) in one embodiment. Interconnection balls 954 are ref lowed, i.e., heated to a melt and re-solidified, to mount electronic component packages 201 to another structure such as a printed circuit motherboard.

The formation of interconnection balls 954 is optional. In one embodiment, interconnection balls 954 are not formed.

From form interconnection balls operation 124 (or directly from form solder mask operation 122 in the event that form interconnection balls operation 124 is not performed), flow moves to a singulate operation 126. In singulate operation 126, array 200 is singulated, e.g., by sawing. More particularly, package body 322, first buildup dielectric layer 524, second buildup dielectric layer 736, and solder mask 850 are cut to singulate electronic component packages 201 from one another. As set forth above, a plurality of electronic component packages 201 are formed simultaneously in array 200 using the methods as described above. Array 200 is singulated to singulate the individual electronic component packages 201 from one another in singulate operation 126.

In one embodiment, prior to singulation, a ball grid final thickness operation is performed to insure that interconnection balls 954 have a uniform final thickness and electronic component packages 201 are laser marked. Further, after singulation, electronic component packages 201 are tray loaded, have a FVI gate operation performed thereon, are packed and finally tested.

Although formation of an array 200 of electronic component packages 201 is described above, in other embodiments, electronic component packages 201 are formed individually using the methods as described above.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A method of forming an electronic component package, the method comprising:
   attaching a plurality of integrated circuit (IC) chips to a carrier at a spacing no more than 100 micrometers (μm) apart in a first direction, wherein each of the IC chips has a height dimension of at least 400 μm and a width dimension in the first direction greater than the height dimension;
   laminating a dielectric sheet around the IC chips, said laminating comprising pressing the dielectric sheet onto the attached IC chips to cause the dielectric sheet to flow around the attached IC chips and to fill the spaces between the attached IC chips, wherein the dielectric sheet forms a package body surrounding the IC chips;
   removing the carrier;
   forming a buildup dielectric layer on a respective active surface of each of the IC chips and on the package body;
   forming a circuit pattern on the buildup dielectric layer; and
   cutting at least the package body and the buildup dielectric layer to singulate the electronic component package.

2. The method of claim 1, wherein the package body covers at least five sides of each of the IC chips.

3. The method of claim 2, wherein the at least five sides of each of the IC chips comprise four lateral sides and an active side of each of the IC chips.

4. The method of claim 2, wherein the package body comprises a first thickness for those portions of the package body in the spaces between the attached IC chips, and a second thickness, less than the first thickness, for those portions of the package body over the attached IC chips.

5. The method of claim 1, comprising:
   forming a second buildup dielectric layer on the buildup dielectric layer and the circuit pattern;
   forming a second circuit pattern on the second buildup dielectric layer and electrically connected to the circuit pattern; and
   attaching a package interconnection structure to the second circuit pattern at a location directly vertically aligned with one of the IC chips.

6. The method of claim 1, comprising after said laminating the dielectric sheet, cutting the dielectric sheet to conform to the shape of the carrier.

7. The method of claim 1, comprising after said forming the buildup dielectric layer, forming a via aperture through the formed buildup dielectric layer.

8. A method of forming an electronic component package, the method comprising:
   attaching a plurality of integrated circuit (IC) chips to a carrier at a spacing no more than 100 micrometers (μm) apart in a first direction, wherein each of the IC chips has a height dimension of at least 400 μm and a width dimension in the first direction greater than the height dimension;
   laminating a dielectric sheet around the IC chips, said laminating comprising pressing the dielectric sheet onto the attached IC chips to cause the dielectric sheet to flow around the attached IC chips and to fill the spaces between the attached IC chips, wherein the dielectric sheet forms a package body that encloses at least five sides of each of the IC chips and comprises:
   a first planar surface; and
   a second planar surface that is coplanar with a respective surface of each of the IC chips,
   wherein the package body comprises a first thickness for those portions of the package body in spaces between the IC chips and a second thickness, less than the first thickness, for those portions of the package body over the IC chips.

9. The method of claim 8, wherein the at least five sides of each of the IC chips comprise four lateral sides and an active side of each of the IC chips.

10. The method of claim 8, wherein:
    said attaching the plurality of IC chips to the carrier comprises attaching the plurality of IC chips to the carrier with an adhesive; and
    said laminating a dielectric sheet around the IC chips comprises flowing the dielectric sheet around the IC chips and to the adhesive.

11. The method of claim 8, comprising after said laminating the dielectric sheet around the IC chips, cutting the dielectric sheet to conform to the shape of the carrier.

12. The method of claim 8, comprising after said laminating the dielectric sheet around the IC chips:

removing the carrier;

applying a buildup dielectric layer to the second planar surface of the package body and to an active surface of each of the IC chips; and forming a circuit pattern on the buildup dielectric layer.

13. The method of claim 12, comprising:

forming a second buildup dielectric layer on the buildup dielectric layer and the circuit pattern;

forming a second circuit pattern on the second buildup dielectric layer that is electrically connected to the circuit pattern; and attaching a package interconnection structure to the second circuit pattern at a location directly vertically aligned with one of the IC chips.

14. The method of claim 13, comprising after said forming the buildup dielectric layer, forming a via aperture through the formed buildup dielectric layer.

15. A method of forming an electronic component package, the method comprising:

attaching a plurality of integrated circuit (IC) chips to a carrier at a spacing no more than W apart in a first direction, wherein each of the IC chips has a height dimension of at least H and a width dimension in the first direction greater than H, wherein W is no more than 100 micrometers (μm) and the ratio of H to W is at least four;

laminating a dielectric sheet around the IC chips, said laminating comprising pressing the dielectric sheet onto the attached IC chips to cause the dielectric sheet to flow around the attached IC chips and to fill the spaces between the attached IC chips, wherein:

the dielectric sheet forms a package body surrounding the IC chips; and the package body comprises a thickness of at least H for those portions of the package body in the spaces between the IC chips;

removing the carrier;

forming a buildup dielectric layer on a respective active surface of each of the IC chips and on the package body;

forming a circuit pattern on the buildup dielectric layer; and cutting at least the package body and the buildup dielectric layer to singulate the electronic component package.

16. The method of claim 15, wherein H is no greater than 500 μm.

17. The method of claim 15, comprising attaching an adhesive to the carrier, and wherein said attaching the plurality of IC chips to the carrier comprises temporarily attaching the IC chips to the adhesive.

18. The method of claim 15, comprising:

forming a second buildup dielectric layer on the buildup dielectric layer and the circuit pattern;

forming a second circuit pattern on the second buildup dielectric layer that is electrically connected to the circuit pattern; and attaching a package interconnection structure to the second circuit pattern at a location directly vertically aligned with one of the IC chips.

19. The method of claim 15, comprising after said laminating the dielectric sheet around the IC chips, cutting the dielectric sheet to conform to the shape of the carrier.

20. The method of claim 15, comprising after said forming a buildup dielectric layer, forming a via aperture through the formed buildup dielectric layer.

\* \* \* \* \*